United States Patent [19]

Satoh

[11] 4,312,294
[45] Jan. 26, 1982

[54] APPARATUS FOR THERMAL TREATMENT OF SEMICONDUCTORS

[75] Inventor: Ryozo Satoh, Yamato, Japan

[73] Assignee: Tel-Thermco Engineering Co., Ltd., Yokohama, Japan

[21] Appl. No.: 132,735

[22] Filed: Mar. 24, 1980

[30] Foreign Application Priority Data

Mar. 29, 1979 [JP] Japan .................................. 54-36260

[51] Int. Cl.³ .............................................. C23C 13/08
[52] U.S. Cl. .................................. 118/733; 432/250
[58] Field of Search ............... 432/188, 198, 200, 250; 118/719, 733, 900; 427/255.2, 255.3, 255.4

[56] References Cited

U.S. PATENT DOCUMENTS

| | | | |
|---|---|---|---|
| 3,441,000 | 4/1969 | Burd et al. | 118/719 |
| 3,517,643 | 6/1970 | Goldstein et al. | 118/715 |
| 3,526,205 | 9/1970 | Rosenheinrich | 118/500 X |
| 3,554,162 | 1/1971 | Cota et al. | 118/715 |
| 3,578,495 | 5/1971 | Pammer et al. | 427/94 |
| 3,666,546 | 5/1972 | Reuter et al. | 427/93 |
| 3,698,354 | 10/1972 | Reuschel et al. | 118/715 |
| 3,701,682 | 10/1972 | Gartman et al. | 156/611 |
| 3,750,620 | 7/1973 | Eversteijn et al. | 118/735 |
| 3,805,735 | 4/1974 | Reuschel et al. | 118/728 |
| 4,096,822 | 6/1978 | Yamawaki et al. | 118/500 X |
| 4,129,090 | 12/1978 | Inaniwa et al. | 118/728 |
| 4,235,841 | 11/1980 | Zimmerman | 422/112 |

*Primary Examiner*—Evan K. Lawrence
*Attorney, Agent, or Firm*—George R. Clark; Neil M. Rose; Allen J. Hoover

[57] ABSTRACT

In an apparatus for thermal treatment of semiconductors in a treating gas, a cylindrical plug extends into a treating tube so as to substantially fill the treating tube, as far as the cylindrical plug extends into the treating tube, except for a clearance provided around the cylindrical plug, between the cylindrical plug and the treating tube, whereby formation of convection currents in the treating gas is prevented. The cylindrical plug may be separate from a sealing closure, integral with the sealing closure, or integral with the treating tube. If integral with the treating tube, the cylindrical plug has a tubular portion and a bottom portion, which plugs the tubular portion but is removable.

6 Claims, 3 Drawing Figures

APPARATUS FOR THERMAL TREATMENT OF SEMICONDUCTORS

BACKGROUND OF THE INVENTION

The present invention relates to an improvement in a furnace or similar apparatus for thermal treatment of semiconductors such as wafers for the production of integrated-circuit chips.

As a consequence of recent trends, there has been a gradual tendency for semiconductors to be processed as wafers of larger sizes, but various problems thus have arisen. As an example, convection currents of a treating gas become significant, and it thus becomes difficult to maintain uniform temperature distribution within a furnace for thermal treatment of semiconductors.

In such apparatus, a wafer placed on a boat is set substantially at the center of a treating tube, and a treating gas is introduced into the treating tube from a gas inlet. A predetermined treatment is carried out while the treatment temperature is maintained at a prescribed level, e.g., 400° to 1200° C.

In such thermal treatment, it is required that the internal temperature be uniform axially of a wafer or the like to be treated and, moreover, to be uniform in a direction perpendicular to the axis of the treatment tube. Ordinarily, it is desired that the temperature fluctuation be controlled within a range of ±1° C.

In prior efforts to achieve a uniform temperature within a typical furnace for thermal treatment of semiconductors, it is known for the length of the furnace to be increased or for a heater associated with the furnace to be divided. Typically, the heater is divided axially into three parts, and electric power applied to the heater is set so that the part of the heater at each end provides temperatures higher than the temperature provided by the part of the heater therebetween, whereby the length of a region of uniform heating temperature extending longitudinally of the treating tube is increased.

A boat carrying a wafer is inserted into and withdrawn from the treating tube after a removable closure, which may be attached to an end portion of the treating tube, has been detached therefrom. Therefore, so as to avoid rapid heating of a wafer or the like to be treated or rapid cooling thereof, an extra space must be provided in the treating tube for moderating thermal influences on the wafer or the like. Ordinarily, the end portion of the treating tube on the closure end, which is exposed to the outer atmosphere, is elongated to form a low-temperature zone having a considerable length.

However, the extra space, when provided, is cooled by contact of the elongated portion of the treating tube with the outer atmosphere so as to lower the temperature within the elongated portion of the treating tube, whereupon the length of the region of uniform heating temperature is reduced. Furthermore, convection currents are produced between the extra space and the zone of uniform heating temperature extending longitudinally of the treating tube, and such currents circulate concentrically in the upper and lower portions of the region of uniform heating temperature. Thus, a low-temperature zone is formed, which divides the region of uniform heating temperature into two parts, and effective length of the region of uniform heating temperature is reduced.

SUMMARY OF THE INVENTION

The present invention seeks to eliminate such disadvantages of prior apparatus, as discussed above, and may be embodied in a furnace or similar apparatus for thermal treatment of semiconductors.

The apparatus comprises a treating tube, which is adapted to hold semiconductors, and which has a fitting flange on one end of the treating tube, and a sealing closure having a fitting flange adapted to be interfitted with the fitted flange of the treating tube so as to seal said end. The sealing closure is removable from the treating tube so as to open said end.

As improved by the present invention, the apparatus comprises a cylindrical plug, which is inserted into the treating tube through said end so as to substantially fill the treating tube, as far as the cylindrical plug extends into the treating tube, except for a clearance provided around the cylindrical plug, between the cylindrical plug and the treating tube.

The cylindrical plug may be inserted slidably into the treating tube so as to be removable from the treating tube. If so, the cylindrical plug may be separate from the sealing closure, integral with the sealing closure, or integral with the treating tube. If integral with the treating tube, the cylindrical plug has a tubular portion, around which the clearance is provided, and a bottom portion, which is adapted to be mounted to the tubular portion so as to plug the tubular portion and to be removed from the tubular portion.

Accordingly, formation of local treating-gas convection currents flowing longitudinally of the treating tube is prevented, and the temperature distribution is made to be uniform not only axially of the treating tube but also in a direction perpendicular to the axis of the treating tube. If the treating tube has an extending portion exposed to the outer atmosphere, heat diffusion is reduced. The electric power consumed by the heater is decreased.

The present invention will be described in detail below with reference to embodiments illustrated in the accompanying drawings.

DETAILED DESCRIPTION OF PREFERRED EMBODIMENTS

Figure 1:
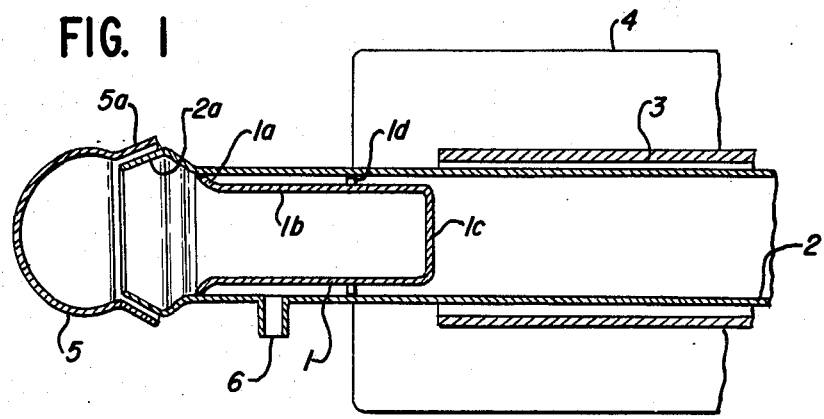
FIGS. 1 through 3 are similar, fragmentary, longitudinal, sectional views of three alternative embodiments of the present invention.

As shown in FIG. 1, a furnace according to this invention for thermal treatment of semiconductors comprises a treating tube 2, which is adapted to hold semiconductors, and which has a fitting flange 2a on its left end as shown, and a sealing closure 5, which has a fitting flange 5a adapted to be interfitted with the fitting flange 2a so as to seal its left end as shown. The sealing closure 5 is removable from the treating tube so as to open said end.

As shown in FIG. 1, a heater 3 is disposed around a substantial portion of the treating tube 2, and the heater 3 is covered by a heat-insulating member 4. An elongated portion of the treating tube 2 extends from the heat-insulating member 4 so as to be exposed to the outer atmosphere. An outlet for a treating gas, which is introduced into the treating tube 2 through an inlet (not shown) in a known manner, is provided in the extending portion of the treating tube 2. The fitting flange 2a is provided on the extending portion of the treating tube 2.

As improved by the present invention, the furnace of FIG. 1 comprises a cylindrical plug 1, which is inserted into the treating tube 2 through its left end as shown so as to fill the treating tube 2, as far as the cylindrical plug 1 extends into the treating tube 2, except for a clearance provided around the cylindrical plug 1, between the cylindrical plug 1 and the treating tube 2.

As shown in FIG. 1, the cylindrical plug 1 is inserted slidably into the treating tube 2 so as to be removable from the treating tube 2. The cylindrical plug 1 has a flanged portion 1a, a tubular portion 1b, and a bottom portion 1c, which are integral with each other. The cylindrical plug 1 also has a plurality of integral projections 1d being formed on and projecting outwardly from the outer surface of the tubular portion 1b. Alternatively, the projection 1d may be formed on the inner surface of the treating tube 2, rather than on the outer surface of the treating tube 2. The flanged portion 1a and the radial projections 1d fit slidably within the treating tube 2 so as to support the cylindrical plug 1 within the treating tube 2.

In the embodiment of FIG. 1, the sealing closure 5 and the cylindrical plug 1 may be removed from the treating tube 2, whereupon a boat (not shown) carrying treated wafers (not shown) may be withdrawn from the treating tube 2 through its left end as shown. Thereupon, another boat (not shown) carrying untreated wafers may be inserted into the treating tube 2 through the same end, whereupon the cylindrical plug 1 may be replaced so as to be supported by the flanged portion 1a and the plural projections 1d, and the sealing closure 5 may be replaced after the cylindrical plug 1 has been replaced.

Figure 2:
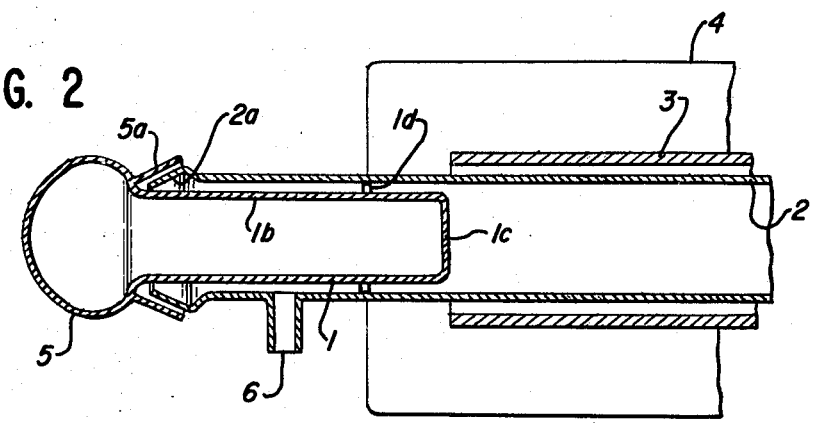

In the embodiment of FIG. 2, the cylindrical plug 1 is formed so as to be integral with the sealing closure 5. Other structural elements of the embodiment of FIG. 2 are the same as those of the embodiment of FIG. 1.

Figure 3:
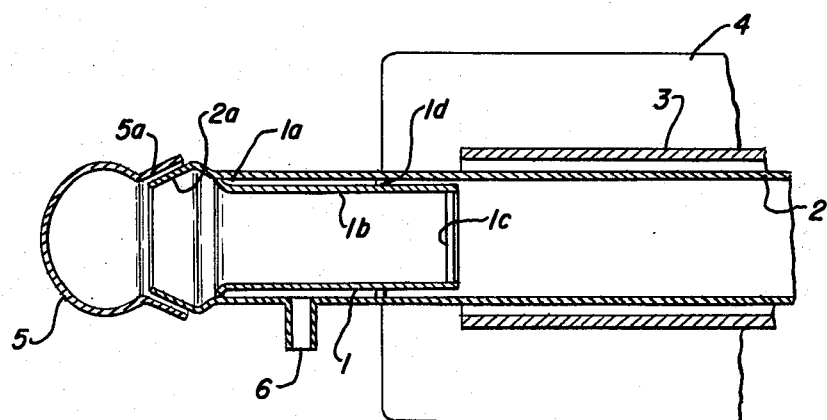

In the embodiment of FIG. 3, the cylindrical plug 1 is formed so as to be integral with the treating tube 2 at the flanged portion 1a, whereupon the bottom portion 1c of the cylindrical plug 1 is mounted to the tubular portion 1b so as to plug the tubular portion 1b but is removable from the tubular portion 1b. When the bottom portion 1c is removed, boats (not shown) carrying wafers (not shown) may pass through the tubular portion 1b, as for insertion of boats and wafers into the treating tube 2 and for withdrawal of boats and wafers from the treating tube 2.

In each of the embodiments of FIGS. 1 through 3, when the temperature within the treating tube is elevated to a predetermined level by the heating element 3, formation of convection currents of the treated gas is prevented by the cylindrical plug 1. As fluid resistance within the clearance around the cylindrical plug 1 is greater than fluid resistance without the cylindrical plug 1, convection currents do not form readily within the clearance around the cylindrical plug 1.

Moreover, the inner side of the end portion of the treating tube 2 is substantially closed by the bottom portion 1c of the cylindrical plug 1, whereby flow of the treating gas is interrupted by bottom portion 1c. Hence, no convection current flowing toward the vicinity of the sealing closure 5 is produced.

Pursuant to the present invention, the cylindrical plug 1 is inserted into the treating tube 2 from that end portion (of the treating tube 2) to which the sealing closure 5 is to be attached, whereby no treating-gas convection current is produced in the clearance between the cylindrical plug 1 and said end portion of the treating tube 2, and whereby a substantially heat-insulating furnace is constructed. By this characteristic structure, formation of the aforementioned local low-temperature region is effectively prevented, and heat diffusion is remarkably reduced. Therefore, by reason of the present invention, a longer region of uniform heating temperature can be obtained, more stably, than can be obtained in conventional apparatus having the same furnace length. Moreover, the bottom portion 1c of the cylindrical plug 1 provides a substantially closed end face in a direction perpendicular to the axis of the treating tube 2. By reason of the present invention, the temperature within the treating tube 2 does not need to be elevated excessively near the sealing closure 5 for the temperature within the treating tube 2 to be made longitudinally uniform to a set temperature of the heater 3. Thus, a reduction in the electric power consumed by the heater 3 is permitted.

I claim:

1. In an apparatus for thermal treatment of semiconductors with a treating gas, of a type comprising
    (a) a treating tube, which is adapted to hold semiconductors, which has a fitting flange at one end of the treating tube, which has a tubular wall, and which has an outlet provided in the tubular wall for the treating gas, and
    (b) a sealing closure, which has a fitting flange adapted to be interfitted with the fitting flange of the treating tube so as to seal said end, and which is removable from the treating tube so as to open said end,
the improvement wherein the apparatus comprises
    (c) a cylindrical plug, which has a closed end, said plug being insertable, closed end first, into the treating tube so as to extend into the treating tube to substantially fill the treating tube, as far as the closed end of the cylindrical plug, except for a clearance provided around the cylindrical plug, between the cylindrical plug and the treating tube, said clearance preventing ready formation of convection currents in the treating gas.

2. The improvement of claim 1 wherein the cylindrical plug is integral with the treating tube, wherein the cylindrical plug has a tubular portion, around which the clearance is provided, and wherein said closed end is removable from the tubular portion.

3. The improvement of claim 1 wherein the cylindrical plug is slidable within the treating tube so as to be removable from the treating tube.

4. The improvement of claim 3 wherein the cylindrical plug is separable from the sealing closure.

5. The improvement of claim 3 wherein the cylindrical plug is integral with the sealing closure, and wherein the cylindrical plug is closed by the sealing closure at its end opposite said closed end.

6. The improvement of any one of claims 1 through 5 wherein the outlet for the treating gas is located in the tubular wall of the treating tube, at a location where the treating tube is filled by the cylindrical plug except for the clearance provided around the cylindrical plug, so as to confine the treating gas within the clearance around the cylindrical plug as the treating gas flows to the outlet.

* * * * *